United States Patent Office 3,520,686
Patented July 14, 1970

3,520,686

INDIRECT PHOTOLYTIC ETCHING OF SILICON DIOXIDE

Robert F. Kopczewski and Donald L. Schaefer, Schenectady, N.Y., assignors to General Electric Company, a corporation of New York No Drawing. Filed May 29, 1967, Ser. No. 642,160
Int. Cl. G03c 5/00
U.S. Cl. 96—36 5 Claims

ABSTRACT OF THE DISCLOSURE

A method for selectively etching patterns in surfaces composed primarily of silicon dioxide is disclosed wherein an inorganic fluoride in contact with said surface is acidified by the photolytic decomposition of an organic compound which produces an acidic decomposition product whereupon the surface is chemically attacked and etched in the areas thereof which are exposed to activating radiation at a rate which is dependent upon the intensity of illumination in any given area. Both liquid and solid etchant systems are disclosed.

The invention herein described was made in the course of a contract with the Bureau of Ships, United States Navy.

Attention is drawn at this point to the patent applications of Donald L. Schaefer, Ser. No. 642,159, now U.S. Pat. No. 3,489,564, granted Jan. 13, 1970, entitled "Photolytic Etching of Silicon Dioxide" and Ser. No. 642,201 entitled "Etching of Silicon Dioxide by Photosensitive Solutions" both filed concurrently herewith and assigned to the assignee of the present invention.

BACKGROUND OF THE INVENTION

In the past when it has been desired to etch the surface of glass or quartz materials for either decorative or optical purposes, or to etch patterns through silicon dioxide surface films formed on the surfaces of so-called silicon "chips" for use as semiconductive circuit elements in miniaturized "integrated" circuits, it has been necessary to coat those areas which are not to be etched with a protective layer of a material which is resistant to the etchant, leaving exposed those areas which are to be etched. The etchant, usually hydrofluoric acid or a solution with ammonium fluoride is then applied and etching of the surface is accomplished in those exposed areas. Where a high degree of precision is necessary in forming the etched pattern as, for example, in the manufacture of optical reticles or in the manufacture of silicon chips, it has been conventional to use a suitable "photoresist" process. In general, these processes have involved coating the surface to be etched with a material which, when suitably irradiated, is converted from a soluble to an insoluble material. In practice, the surface to be etched is coated with the material, exposed to the desired pattern of activating radiation through an appropriate photographic negative, for example, and the unexposed still soluble areas of the coating removed by washing with an appropriate solvent, leaving behind the insoluble coating covering the surface areas which were exposed. The unprotected areas of the surface may then be etched with the etchant, after which the photoresist mask is removed. It will be apparent that this process has several inherent disadvantages. The photolytic reaction of the photoresist materials usually involves a polymerization or cross-linking type of reaction and the edge resolution between reacted and unreacted zones is frequently of uncertain quality and may be difficult to reproduce with a high degree of accuracy from one specimen to another. Considerable care must be exercised during the washing and the etching steps to prevent the insoluble portions of the photoresist pattern from lifting from the surface, yet all the soluble material must be removed. Undercutting of the insoluble pattern by the etchant is unavoidable and virtually impossible to control which introduces variations between successively etched patterns. The etchants employed in the etching of silicon dioxide are toxic and in the case of hydrofluoric acid, extremely dangerous to use. It would be advantageous to eliminate the necessity for the use of the photoresist material, the multiple step process attendant therewith and the use of the hazardous etchants.

It is therefore a principal object of this invention to provide a process for etching predetermined patterns in surfaces composed essentially of silicon dioxide which does not require the use of a mask of the photoresist type or the use of etchants containing hydrofluoric acid.

It is a further object of this invention to provide a method for the selective etching of a silicon dioxide surface at controllably different rates in different zones thereof simultaneously.

Other and specifically different objects of this invention will become apparent to those skilled in the art from the following disclosure.

SUMMARY OF THE INVENTION

Briefly stated, this invention provides a method for the selective etching of surfaces composed primarily of silicon dioxide by contacting said surface with an etchant composed of an inorganic fluoride compound and an organic compound which is photolytically decomposable to produce acidic decomposition products when and where exposed to activating radiation, which products react with said inorganic fluoride to produce chemically reactive species which chemically attack and etch the illuminated areas of said surface at the interface between said etchant and said surface at a rate which is dependent in part on the intensity of the illumination.

DESCRIPTION OF THE PREFERRED EMBODIMENTS

More particularly, the following examples illustrate how the invention may be practiced.

Example 1

A solution of 0.1 molar N-chlorosuccinimide and 0.1 molar sodium fluoride in methanol was prepared and a silicon wafer having a surface layer of about 6000 A. of silicon dioxide was submerged therein, the liquid depth over the oxide surface being about 1 mm. A pattern of illumination from a 1000 watt high intensity mercury lamp was projected upon the liquid-to-solid interface through the thin liquid layer for about 15 minutes. Upon examination, the silicon dioxide surface layer was found to have been etched in the illuminated areas but not in the non-illuminated areas.

Example 2

The process set forth in Example 1 was repeated except that water was substituted for the methanol. Again, etching was achieved in the illuminated areas but not in the non-illuminated areas.

Example 3

The process set forth in Example 1 was repeated except that N-bromosuccinimide and ammonium fluoride were substituted, respectively, for the N-chlorosuccinimide and the sodium fluoride, the ratio of bromine to fluorine being about 1:1. Again, etching was achieved in the illuminated areas but not in the non-illuminated areas.

Example 4

The process set forth in Example 3 was repeated except that water was substituted for the methanol. Again, etching was achieved in the illuminated areas but not in the non-illuminated areas.

Example 5

Solutions of 0.1 molar N-chlorosuccinimide and 0.1 molar sodium fluoride were prepared in a polymer of 10 percent solids of alcohol soluble butyrate (sold under the tradename of ASB by the Eastman Chemical Products, Inc.) in methanol. A film about 20 microns in thickness was cast upon the oxidized surface of a silicon wafer similar to those used in Examples 1 and 2. The polymeric film was then exposed to a pattern of illumination from a 1000 watt high intensity mercury lamp for about 60 minutes in an air atmosphere having a high relative humidity. When the polymer layer was removed, the silicon dioxide layer was found to have been etched in areas corresponding to the illuminated areas of the polymer film and not etched in non-illuminated areas.

From the foregoing, it will be apparent that in accordance with this invention, a method is provided whereby selective etching of silicon dioxide surfaces may be achieved by the photolysis of either a liquid or solid etchant in contact with said surface to produce an etched pattern in said surface which has a point-to-point correspondence to the pattern of activating radiation used to photolyze the etchant. The precise nature of the photolytically induced reaction is not known but certain requirements appear necessary. The inorganic fluoride must be soluble in the solvent utilized for the photodecomposable organic compound. The photolytically decomposable organic compound must decompose upon photolysis to produce a reaction product which is strongly acid, and must contain a halogen having a bond dissociation energy of not more than 150 kilocalories per mole. One possible reaction mechanism is that the acidic photolytically produced reaction product of the organic compound reacts with fluoride ions supplied by the inorganic fluoride to produce hydrofluoric acid which then etches the silicon dioxide surface in the irradiated areas. Alternatively, the essentially neutral equilibrium between the fluoride compound and fluoride ions may be biased by the presence of excess hydrogen ions so that hydrofluoric acid is produced. Additionally, it may be that the reaction produces halogen fluorides of the type $X_mF_n$ such as, for example, the known compounds ClF, $ClF_3$, $BrF_3$ or $BrF_5$, all of which are known to be etchants for silicon dioxide and which have bond dissociation energies in the 50 to 65 kilocalorie per mole range. However, it must be recognized that any one or a combination of any or all of these mechanisms may be involved. For these reasons, the applicants do not wish to be bound by or limited to any particular theory of the reactions involved.

From all the foregoing, it will be apparent to those skilled in the art that variations of the specific etching techniques may be readily accomplished within the scope of the inveniton. Therefore the invention should not be limited except as defined by the following claims.

What we claim as new and desire to secure by Letters Patent of the United States is:

1. The method of photoetching a silicon dioxide surface comprising the steps of providing a common liquid-solid or solid-solid interface between said surface and an etching media comprising a soluble inorganic fluorine compound providing a source of fluoride ions and a soluble N-halosuccinimide which is photolytically decomposable to produce a strongly acidic product which reacts with said fluoride ions to produce chemically reactive species which chemically attack and etch silicon dioxide, and exposing said etching media under non-anhydrous conditions to a pattern of activating radiation to form said chemically reactive species at said interface for a time sufficient to cause etching of said surface in zones having a point-to-point correspondence with areas illuminated by said activating radiation.

2. The method recited in claim 1 wherein said etching media is a liquid.

3. The method recited in claim 2 wherein said liquid comprises a solution of said inorganic fluorine compound and an N-halosuccinimide in water.

4. The method recited in claim 2 wherein said liquid comprises a solution of said inorganic fluorine compound and an N-halosuccinimide in methanol.

5. The method recited in claim 1 wherein said soluble inorganic fluorine compound providing a source of fluorine ions is a compound selected from the group consisting of the alkali metal fluorides and ammonium fluoride.

References Cited

UNITED STATES PATENTS

| | | | |
|---|---|---|---|
| 2,841,477 | 7/1958 | Hall | 204—157.1 X |
| 2,875,046 | 2/1959 | Marron et al. | 96—36 X |
| 3,122,463 | 2/1964 | Ligenza et al. | 156—4 |
| 3,122,817 | 3/1964 | Andrus | 96—36.2 X |
| 3,255,005 | 6/1966 | Green | 96—36 |
| 3,271,180 | 9/1966 | White | 96—36 X |
| 3,346,384 | 10/1967 | Gaynor | 96—36 |

GEORGE F. LESMES, Primary Examiner

R. E. MARTIN, Assistant Examiner

U.S. Cl. X.R.

96—36.2